United States Patent [19]
Hämäläinen et al.

[11] Patent Number: 5,812,404
[45] Date of Patent: Sep. 22, 1998

[54] METHOD FOR OVERALL REGULATION OF THE HEADBOX OF A PAPER MACHINE OR EQUIVALENT

[75] Inventors: Jari Hämäläinen, Jyskä ; Petri Nyberg, Jyväskylä , both of Finland

[73] Assignee: Valmet Corporation, Helsinki, Finland

[21] Appl. No.: 634,465

[22] Filed: Apr. 18, 1996

[51] Int. Cl.⁶ .................................. D21F 1/08; D21F 1/06
[52] U.S. Cl. ...................... 364/471.02; 162/252; 162/253
[58] Field of Search ...................... 364/148, 149, 364/152, 471.01, 471.02; 366/160.1; 264/517, 518; 162/258, 259, 336, 262, 216, 252, 253, 198, DIG. 10, 212, 338, 343

[56] References Cited

U.S. PATENT DOCUMENTS

| | | | |
|---|---|---|---|
| 3,666,621 | 5/1972 | Adams | 162/198 |
| 4,374,703 | 2/1983 | Lebeau et al. | 162/253 |
| 4,500,968 | 2/1985 | Bialkowski | 364/471 |
| 4,680,089 | 7/1987 | Aral et al. | 162/198 |
| 4,707,779 | 11/1987 | Hu | 364/148 |
| 4,748,400 | 5/1988 | Typpo | 324/61 R |
| 4,764,253 | 8/1988 | Cheshire et al. | 162/198 |
| 5,071,514 | 12/1991 | Francis | 162/259 |
| 5,072,404 | 12/1991 | Schmitzer et al. | 364/510 |
| 5,082,530 | 1/1992 | Keskiivari et al. | 162/216 |
| 5,381,341 | 1/1995 | Herrala et al. | 364/471 |
| 5,490,905 | 2/1996 | Huovila et al. | 162/212 |
| 5,603,806 | 2/1997 | Kerttula | 162/198 |
| 5,688,372 | 11/1997 | Huovilla et al. | 162/212 |
| 5,707,495 | 1/1998 | Heinzmann et al. | 162/343 |

FOREIGN PATENT DOCUMENTS

| | | | |
|---|---|---|---|
| 0541457 | 5/1993 | European Pat. Off. | D21G 9/00 |
| 81848 | 8/1990 | Finland | D21F 1/00 |
| 85731 | 12/1990 | Finland | D21F 1/00 |

OTHER PUBLICATIONS

"Mathematical Modelling and Simulation of Fluid Flows in the Headbox of Paper Machines", Jari Hamalainen, University of Jyvaskyla, Department of Mathematics, May, 1993.

J. Hamalainen and T. Tillhonen, "Modelling and Simulation of Fluid Flows in a Paper Machine Headbox", Published at ICIAM/GAMM 95 Symposium, Hamburg, Germany, Jul. 3–7, 1995 and in Zeitschrift fur Angewandte Mathematik und Mechanik, vol. 76, Supplement 4, 1996, pp. 65–68.

*Primary Examiner*—Emanuel Todd Voeltz
*Assistant Examiner*—Tony M. Cole
*Attorney, Agent, or Firm*—Steinberg & Raskin, P.C.

[57] ABSTRACT

A method for the continuous overall regulation of a single-layer or multi-layer headbox of a paper, board or pulp-draining machine. A physical fluid flow model of a pulp suspension flow discharged from the headbox to be regulated is formed and solved to obtain a simulated flow state based, e.g., on data on the geometry of the headbox and initial and boundary conditions related to the headbox. A target flow state based on the quality requirements of the paper produced from the pulp suspension flow and the costs of operation and runnability of the machine is obtained and a difference between the simulated flow state obtained as the solution of the flow model and the target flow state is determined. This difference constitutes a cost function which is optimized to determine optimal regulation values and set values for instrumentation devices and actuators of the headbox which affect the pulp suspension flow. The optimal regulation and set values are provided to the devices and actuators of the headbox such that the devices and actuators of the headbox may operate at the optimal regulation and set values.

27 Claims, 5 Drawing Sheets

METHOD FOR OVERALL REGULATION OF THE HEADBOX OF A PAPER MACHINE OR EQUIVALENT

FIELD OF THE INVENTION

The present invention relates to a method for continuous overall regulation of a single-layer or multi-layer headbox of a paper, board or pulp-draining machine.

BACKGROUND OF THE INVENTION

In a way known in the prior art, a pulp suspension jet is fed out of a slice opening or slice channel of a headbox of a paper or board machine onto a forming wire or into a gap between a pair of forming wires. As known in the prior art, the instrumentation of the headbox consists of machine controls and of quality and grade regulations, which include, with respect to the operation of the headbox, regulations of the levels, flow rates and pressures at the short-circulation pumps, sorters, de-aerators, and equalizing tanks, controls of the valves of recirculation flows, dilution feeds and edge flow feeds, etc., as well as controls of the actuators of the headbox, which controls regulate, e.g., the geometry and the cross-direction profile of the slice channel.

Each individual actuator in the headbox generally has an analogical or digital regulator of its own, which receives a set operating value from the operator or from an optimal regulator operating with respect to some quality or grade quantity of the paper. As an example of an optimal regulator, the prior art basis weight regulation system of a paper machine can be mentioned, which system is usually based on profiling of the shape of the slice opening or the supply of dilution fluid. By means of optimal regulators of the basis weight profile, attempts are made to compensate especially for the shape of the basis weight profile which is measured at the final end of the dryer section and which arises when water, fillers and fibers are removed out of the paper web in the former and in the press section possibly unevenly in the cross direction, when the web is stretched in the machine direction while shrinking in the cross direction during drying of the paper, but also faults in the pulp jet arising in or before the headbox may be compensated for.

From the prior art, a system for the control of the top slice bar at the headbox of a paper machine is known, which system comprises a bevel-gear stepping-motor actuator, by whose means the slice-regulating top slice bar is controlled by means of regulation spindles attached to the bar at a spacing of about 7 cm to about 15 cm. The spindles are displaced by means of the actuator provided at their opposite ends. Generally, the profiling of the top slice bar of the slice opening takes place so that each regulation gear is controlled separately by means of a successive sequence of treatment. In order that the positioning can be carried out with the required precision of about 10 $\mu$m, an electronic system for measurement of the locations of the regulation spindles is also needed. In a way known in the prior art, the top slice bar can be controlled by means of an optimal system of regulation of the basis weight, which system is, according to the prior art, a response regulator based on the measured location and shape of unit response. Even though, by means of this system of regulation based on the top slice bar it is possible to affect the basis weight profile efficiently, a change in the geometry of the slice opening also has a great effect on the flow field in the jet, in particular on the velocity components in the cross direction and in the machine direction, which is commonly not taken into account in the prior art regulators. The flow field determines the directions of the fibers (fiber orientation) in the structure of the paper, which again affects the anisotropic behavior of the strength and the determination potential of paper.

With respect to patent literature related to the present invention, reference is made, by way of example, to the following publications: European Patent Publication No. 0 541 457 and U.S. Pat. Nos. 3,666,621, 4,374,703, 4,500,968, 4,680,089, 4,707,779, 4,748,400, and 5,071,514.

Regarding the current assignee's recent patents concerning systems of regulation of the headbox, reference is made to Finnish Patent Nos. 81,848 (which corresponds to European Patent Publication No. 0 408 894) and 85,731 (which corresponds to European Patent Publication No. 0 401 188 and U.S. Pat. No. 5,381,341).

In Finnish Patent No. 85,731, a system of regulation of a paper machine is described in which its various actuators are provided with intelligent actuator controllers, and the data communication between a control device higher in the regulation hierarchy and the various actuator controllers is arranged along a path common of the different actuator controllers, and the different actuator controllers are connected to the system of measurement and computing of the profiling of the web is produced by means of the paper machine through a serial bus provided with a network server.

One general object of the present invention is further development of the prior art so that, by means of a paper machine, paper of better quality properties can be produced more economically. As is well known, for example because of new printing methods, the quality requirements imposed on paper are becoming constantly stricter and the requirements imposed on the economy of a paper machine are becoming ever higher. As is also well known, in a paper-making process the headbox is a component which has an entirely decisive role and whose operation largely determines the quality properties of the paper. Later compensation for "defects" produced in the paper web in the headbox is often not even possible, and this compensation, for example regulation of various cross-direction profiles, is quite complicated and results in expenses, for example, in the form of various investments in equipment, their operation and maintenance.

A starting point of the present investment has been the constant increase in the computing and data processing capacity of computers and the lowering of the cost of this capacity so that, for example in the regulation of a paper machine, it is possible to introduce novel applications which were fully impossible earlier because of limitations of the capacity of computers and/or because of the cost of this capacity.

One specific starting point of the present invention has been the theoretical research work taking place both by representatives of the assignee and in different research institutes and universities, with regard to which reference is made to the Doctoral Thesis entitled "Mathematical Modelling and Simulation of Fluid Flows in the Headbox of Paper Machines" by Mr. Jari Hamalainen, Ph.D., one of the inventors of the present patent application, University of Jyvaskyla, Department of Mathematics, Report 57, Jyvaskyla 1993. In the following, a quotation will be made from the beginning of this Doctoral Thesis as a background for the present invention.

"The pulp and paper industry is constantly challenged by complex and contradictory problems of how to produce higher quality paper from lower quality pulp at increased speeds and reduced production costs. Today, the situation is further complicated by introduction of recycled fiber in the paper-making furnish.

Present day paper machine technology has been achieved mostly through experimental work in pilot plants. With increasing speeds and sophistication of modern papermaking, this approach has become too expensive and time consuming so that more effective ways must be found to carry out further development of this technology. One such method is mathematical modelling and numerical simulation. Well known fluid flow models and numerical methods have been available for many years but only in the last few years has the development of supercomputers rendered the use of computational fluid dynamics in practical and industrial applications possible.

Fluid flow phenomena in a paper machine headbox establishes a number of important paper properties, chief of which are basis weight and fiber orientation profiles in the three principal directions. The shape of the headbox internal flow passages and the turbulence they generate are of utmost importance. It is possible to study these phenomena through mathematical modelling of the fluid flow.

Turbulence is a desirable flow phenomenon, as it contributes to fiber dispersion by breaking down fiber flocks and preventing new ones from forming. The problem is how to model turbulence. Although a general fluid flow model, the Navier-Stokes equations, exists, the execution of direct numerical simulation of these equations for turbulent flows is practically impossible. This is because a mesh of finite element approximation should consist of an order of $10^9$ grid points which even today's supercomputers are not fast enough to handle, nor do they have enough memory capacity. Because of practical importance of turbulence, a number of models containing empirical laws have been developed. The most widely used model and one which has also been used in this work, is the k-$\epsilon$ model."

OBJECTS AND SUMMARY OF THE INVENTION

It is an object of the present invention to provide a new and improved method for overall regulation of the headbox of a paper machine in which the disadvantages of the prior art methods are substantially eliminated.

In view of achieving the object stated above, others and those that will come out later, the invention is mainly characterized in that the method comprises a combination of the following steps:

(a.) forming a physical fluid flow model of the pulp suspension flow in the headbox to be regulated;

(b.) solving the flow model by making use of the data on the geometry of the headbox and of other initial values and/or boundary conditions necessary for a solution of the flow model;

(c.) determining the difference between the simulated flow state, which has been obtained as the solution of the flow model, and the flow state adopted as the target, this difference constituting the "cost function", wherein the target flow state is determined by means of the quality requirements of the paper and possibly by means of the costs of operation and the runnability of the paper machine;

(d.) the cost function is optimized and optimal regulation values and set values are determined for the instrumentation devices and actuators of the headbox which affect the quality of the paper web in view of the given cost function; and (e.) after the optimization has been carried out in the preceding stage, the headbox regulation devices are given new optimal regulation and set values in order to operate thereat.

The regulation for a headbox of a paper machine that applies the method of the present invention is based on a physical model starting from equations of fluid dynamics. The physical flow equations of the system of regulation are solved in the geometry of the headbox that is being regulated on the basis of the boundary conditions given by measurements of the headbox, the headbox geometry consisting of the shapes of the flow faces, such as walls that can be bent and the top slice bar. These boundary conditions may include measurements of the static pressure at different locations in the flow duct in the headbox, measurements of the flow rates and flow velocities in different ducts, such as the approach pipe, dilution feeds and edge flow feeds, measurements of the draining of water in the former, and basis weight profiles and fiber orientation profiles measured in the paper web. These measurements are arranged so that the boundary conditions necessary for a solution of the flow equations can be determined unequivocally by means of the measurements. The solution of the flow equations is carried out by means of a computer having high computing capacity by using numerical solution methods, such as known finite element methods (FEM) and finite difference methods (FDM). By using the solvable physical flow model fixed by initial values and boundary conditions, the new, optimal flow conditions in relation to the pre-determined cost function are predicted. This is carried out by means of known methods of optimizing. The control set point values determined by the optimal flow conditions are sent to the actuator of the headbox, such as the slice bar or flow faces profilers, the flow valve actuators and the speed regulators of the pumps so that they operate at these set values. This procedure is repeated within a time period which is short enough to ensure the quality of the produced paper by the paper machine.

Other possible numerical methods for solving the physical flow model from its component fluid flow equations include spectral and spectral-element methods.

The continuous system of regulation of the headbox of a paper machine that applies the method of the present invention has sufficiently accurate knowledge of the flow state of the headbox based on the physical flow model, which is solved by making use of the data on the geometry of the headbox and of other initial and boundary conditions necessary for the solution of the flow model. The system of regulation that applies the invention seeks the best possible regulation and set values for the instrumentation devices and actuators of the headbox in relation to the given cost function. The cost function to be optimized is, as a solution of the flow model, the difference between the flow state obtained on the basis of measurements of quality of the paper, the state and measurements of the instrumentation and the costs of operation and the target flow state that meets the requirements of quality and costs. The target flow state is determined by means of the requirements of quality of the paper, which requirements depend on the flows in the headbox and, if necessary, also by means of the costs of operation of the headbox.

The system of regulation that makes use of the method of the present invention knows the effects of the regulation quantities on the flow state of the headbox and, thus, also on the flow state of the slice jet on the basis of the physical flow model. Thus, the system of regulation finds the best possible regulation and set values by means of optimizing and flow computing, typically without experimentally established responses or without having to slow down or to attenuate the system of regulation of the headbox by means of long time constants and low amplification coefficients, which is usually necessary in the prior art regulation systems. The optimal change computed by means of the flow model includes the overall changes produced by the operations of the actuators in the flow state in the headbox. In such a case, the change taking place as a result of optimizing is far more reliable than in the prior art regulation systems, and as a result of this, an optimal change can be carried out as a single operation. This makes the attainment of optimal quality considerably quicker in paper grade and other changes and reduces the overall costs.

The flow model of a headbox is based on the basic laws of fluid dynamics, i.e., on conservation laws (mass, momentum, energy, angular momentum) or on simplified equations derived from these laws, whose numerical solution is possible by means of a computer having a sufficiently high computational and memory capacity. The initial and boundary conditions of the flow model are on-line or laboratory measurements and information provided by the operator, for example, concerning the runnability and costs.

As the basis of the flow model, it is possible to use the headbox model developed by the assignee, which model consists of models of the header, the equalizing chamber and of the slice channel. By means of such models, it is possible to simulate the flow velocities, the static pressure, and the turbulence quantities. If it is desirable to simulate changes and profiles of consistency, equations for fiber consistency are needed. Such equations are known from the prior art, such as from the model suggested by Morten Steen in his Doctoral Thesis for the accumulation and destruction of fiber flocks. However, it is a drawback of this specific model that the flow velocity field is not affected by the changes in consistency. A flow model that may possibly be applied in the present invention is a multi-phase model which takes into account the reactions of the flow field to changes in consistency by means of interactions of the different phases (water, fibers, fillers, etc.).

In addition to the headbox flow model, in the present invention a transfer model is needed, which determines the relationship between the jet discharged out of the slice opening of the headbox and the finished paper, among other things depending on the jet/wire ratio, because the measurements of basis weight and fiber orientation are made from the paper, whereas the headbox flow model calculates the flow up to the slice jet only. The transfer model must also include information between the location in the system of coordinates in the headbox and the location of the quality quantity measured from finished paper. Such a transfer model is known in itself, and it is used, for example, by the assignee in prior art headbox regulation systems.

The fixing of the parameters in the flow model of a headbox to be applied in the present invention must be carried out specifically for each machine, and if the flow model includes an equation for consistency, the fixing must also be carried out specifically for the paper grade with respect to each paper grade to be produced. In such a case, both direct measurements from the headbox and measurements carried out from the paper are required.

The direct measurements are utilized for fixing the headbox model. All measurements that are economically possible in practice are welcome, but it is easiest to measure static pressures from a number of different positions in the headbox. Flow velocities do not have to be measured, but the velocity profiles needed for the flow model must be known otherwise. In particular, it is necessary to know the velocity profile in the headbox approach pipe. It can be made known, for example, by making the intake profile resistance substantially invariable by means of a perforated plate. Further, data on the flow rates in the headbox are needed, such as the overall flow rate, the recirculation and the edge feed flow rates.

The interdependence between the slice jet provided by the headbox flow model and the paper produced out of the jet is fixed by means of measurements carried out from dried paper. If the velocity of the slice jet is measured, for example, in connection with the starting of the paper machine, this measurement is utilized for verification both of the headbox flow model and the transfer model.

For the purpose of fixing the flow model, it is necessary to know the geometry of the headbox in detail, also under pressure during operation, in order that the flow model should simulate the flows in the correct geometry. Of course, it is advisable to carry out verification measurements from the jet or from paper, either during the starting of a flow-model based regulator or, for example, on-line constantly during operation of the machine. However, according to the conventional prior art technology, the flow field models that have been developed, with their various parameters, are already sufficiently good and accurate to predict properties of paper so reliably that they can be used in optimal regulation in accordance with the present invention.

In the flow model itself, as adaptable and variable parameters needed by the model remain exclusively parameters dependent on the flowing material, such as consistencies, viscosities, fiber and filler compositions and parameters that represent interactions of the different phases, etc. If these parameters vary within narrow limits only, they can also be fixed. For them, it is possible to make a model of their own, which is based on possible simple measurements of, for example, temperature and consistency etc. which can be integrated in the process, or such information is requested from the operator of the paper machine.

The fixing of the transfer model to be fitted between a flow model and the quality properties of paper depends on what measurements can be carried out by means of the measurement devices of the paper machine on-line or in the laboratory. On-line profile measurement of basis weight and formation have been included in the prior art for a long time. Currently, the fiber orientation profile is measured as a routine operation in the laboratory of the paper mill, from where the data can be transferred to the use of the regulation system, for example, by means of a local network.

From the basis weight profile, information is obtained for regulation of the consistency profile, the information measurement reports on the turbulence level in the flow and on the fiber-flock interactions. From the fiber orientation, a direct response is obtained concerning the velocity field in the jet, and conventional regulators based on such a transfer model are in operation. In the flow model, the information obtained from the fiber orientation can be used for verification of the geometry data and measurements in particular with respect to the shapes of the top slice bar of the headbox and of the header as well as, for example, with respect to the flow measurements of edge flow feeds. As a particularly important feature, it should be mentioned that, when a contradiction arises between the prediction given by the flow model and the quality measurements of paper, the headbox is most likely to be contaminated so that the contamination starts interfering with the operation of the headbox. In this manner, a clear indicator or diagnostic system can be produced as to when the runnability and the quality have deteriorated to such an extent that the paper machine should be run down for the purpose of washing.

An optimal regulator based on a flow model gives set values to sub-regulators, such as to those PI or PID regulators that take care of the control of individual actuators, such as valves of additional-feed pipes or spindles of the top slice bar, on the basis of flow measurement, position or location measurement, etc. An optimal regulator based on a flow model may simulate the flow state either on the basis of set values or directly based on measurement. The optimal regulator may take care of failure reporting if some actuator or regulator cannot reach the set value.

In order that the methods of optimization could be employed in the method of regulation in accordance with the present invention, the entire realization of this method step of the invention must be formulated in the form of an assignment of mathematical optimization. In such a case, what is required is a model as accurate as possible for the physical phenomenon concerned, regulation quantities by whose means the optimum is sought, as well as the cost function that is minimized or maximized. In the invention, the regulation quantities may be for example, dilution profile of the pulp suspension, slice-opening profile, recirculation and edge feed flows. The regulation profiles must be given by means of a few parameters; for example, the regulation values of the top slice bar are given by means of the spacing of its spindles. The search for optimal regulation values is carried out by means of a general optimizing method, such as in the commonly known OSD (Optimal Shape Design) assignments, for example, by means of quasi-Newton's methods.

The cost function comprises at least the target profiles of finished paper (basis weight and orientation), but additionally it may also include components related to runnability and/or to consumption of energy. For example, if a certain quality level is set for the paper, it is possible to seek the lowest possible recirculation so that the required quality level (and cost level) are achieved. Different weights are used for different costs; for example, the quality of the paper is adopted as the most important factor, and/or, if the runnability can be improved and/or energy be saved without deteriorating the quality, this is carried out by means of the method of regulation of the present invention. If quality quantities are added to the cost function to be optimized, they must be indicated by means of the velocity profiles and the turbulence of the jet, i.e., in practice, the jet discharged out of the slice opening is optimized.

The efficiency of numerical flow computing and optimization have a direct effect on how quickly the regulation system can react to changes in the running situation. Therefore, in the present invention, both advanced numerical algorithms and high memory/computational capacity of computers are required in order that the regulation of the headbox by means of the flow model should be sufficiently rapid in practice. If necessary, the numerical computing can be accelerated by means of a number of techniques. The optimization is based on changes in the cost function (partial derivatives) in relation to the regulation quantities. Sensitivities in respect of each regulation quantity can be assumed to be independent from one another, in which case they can be computed in parallel by means of computers of several processors. The computing that is being carried out by each by each processor can be enhanced, for example, by means of the perturbation theory. A sensitivity analysis can be carried out in an environment of a linearized solution so that the flow model is solved by means of the perturbation theory (a sort of linearization). Even if the perturbation theory is not absolutely accurate for a non-linear flow model, it, however, predicts a change in the cost function in the correct direction, which is sufficient in the computing of the gradient of the cost function.

The sensitivity of a cost function in relation to the regulation quantities can also be solved by numerically solving a so-called adjoint state equation. Besides the solver of the flow model, this technique also requires a solver of the adjoint state equation. When the gradient (sensitivity) has been computed, elsewhere a real non-linear model is used for optimizing, in which case the optimizing proper is based on the real flow model, and inaccuracies produced by the perturbation theory or by the solution of the adjoint state equation are not seen in the final result of the optimization.

This parallel computing can be used both in the optimization in the way described above and in numerical solution of the flow model. For example, in the finite-element method, the numerical integration is carried out over every element, and at this stage information is not needed concerning the surrounding elements. Further, if the flow model of the headbox consists of a number of sub-models, the sub-models can be solved at the same time, and in between data are updated between the different processors (sub-models) depending on the solutions of the sub-models. The computing can also be enhanced by dividing the optimization into parts. Certain regulation quantities are likely to have a greater effect on the quality of paper than others, in which case the most important parameters are optimized more frequently while reacting to the changes quickly, while other parameters are optimized less frequently.

An optimal regulation of the sort described above can be carried out while making use of a flow model also with some instructable model, such as a neural network, or with some other statistical model. In such a case, the physical flow model is solved in the geometry with several different initial and boundary conditions in advance, and with these results, for example, a statistical model can be adapted or instructed for the flow state of the headbox and/or for the dependence of the cost function in respect of each individual headbox, its flow geometry or flow properties.

In the following, an exemplifying embodiment of the invention and an environment of application of same will be described in detail with reference to the illustrations in the figures in the accompanying drawing. However, the invention is in no way strictly confined to the details of the illustrated embodiments.

BRIEF DESCRIPTION OF THE DRAWINGS

The following drawings are illustrative of embodiments of the invention and are not meant to limit the scope of the invention as encompassed by the claims.

DETAILED DESCRIPTION OF THE INVENTION

Figure 1:
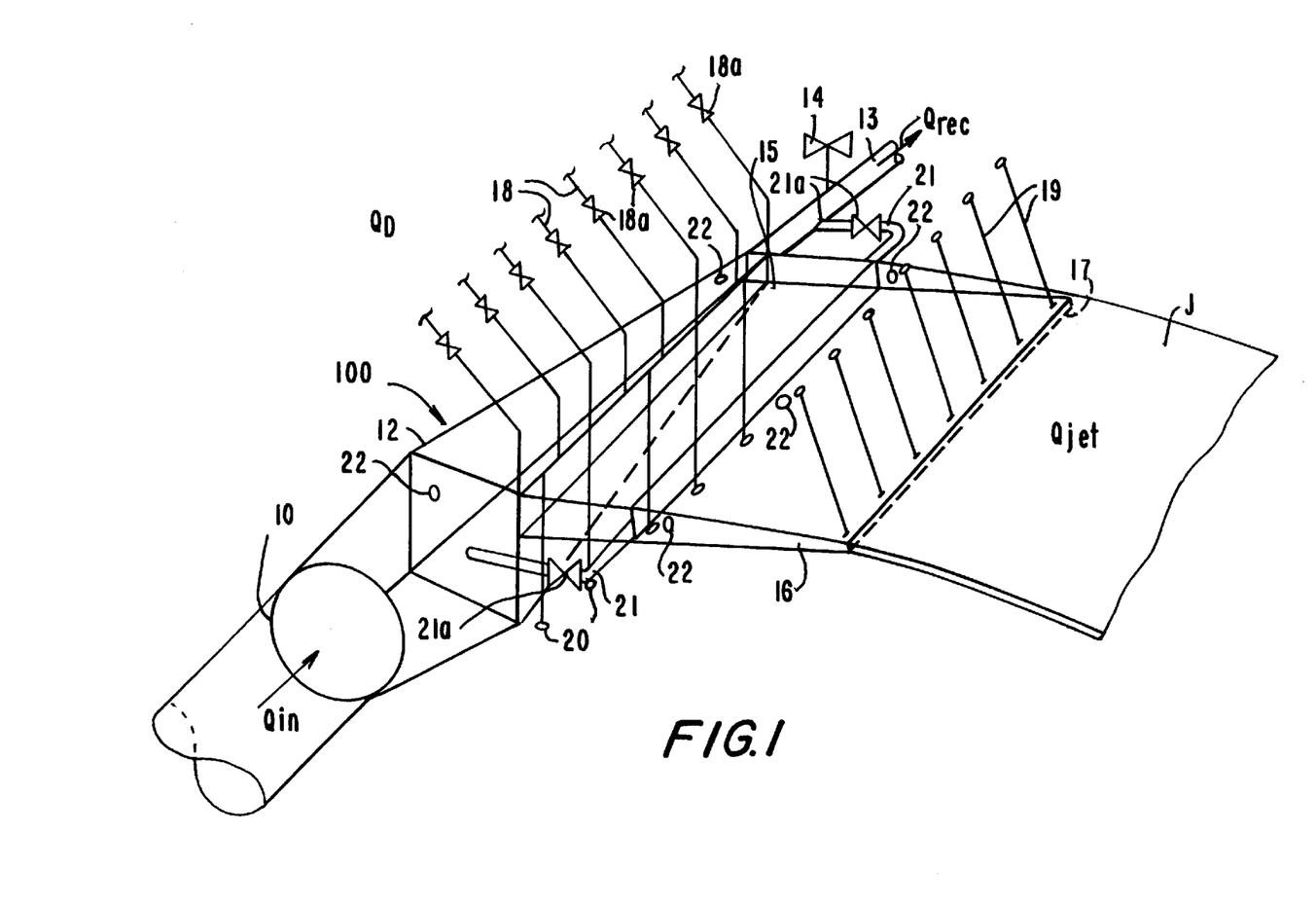
FIG. 1 is a schematic illustration of a single-layer headbox with its most important measurement and regulation devices and flow quantities.
Figure 2:
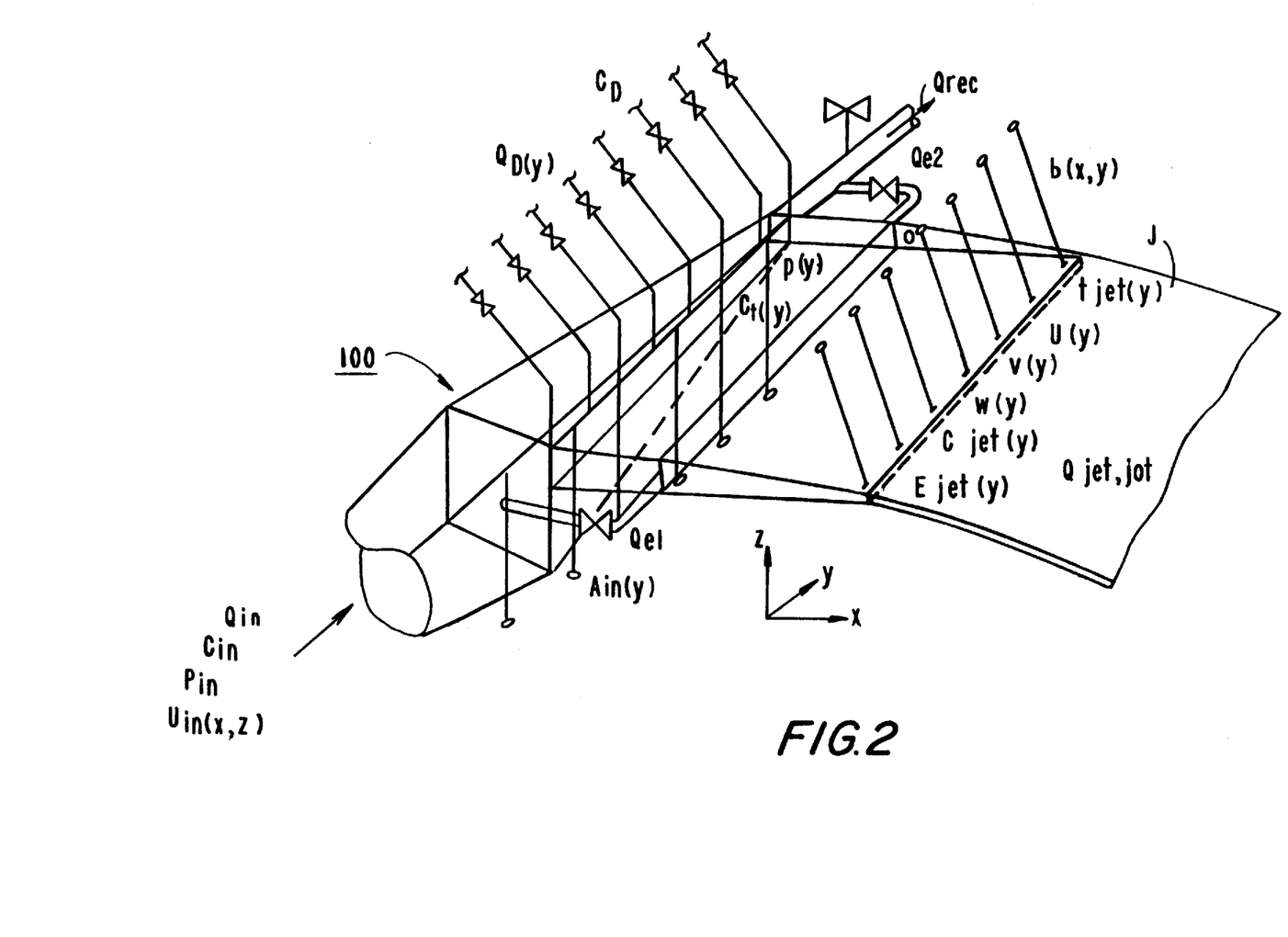
FIG. 2 shows a single-layer headbox as shown in FIG. 1 along with the measurement and regulation quantities and the necessary indications of coordinates applicable to the single-layer headbox of the present invention.

Referring to the accompanying drawings wherein the same reference numerals refer to the same or similar elements, FIGS. 1 and 2 illustrate a single-layer headbox 100 of a paper machine which comprises an approach pipe 10 for the paper stock suspension flow $Q_{in}$, which pipe is connected with a header 12 of the headbox. The header 12 becomes narrower in the flow direction y of the stock suspension, i.e., it tapers. The end of the header 12 opposite to the approach pipe 10 is in flow communication with a recirculation pipe 13 having a flow rate $Q_{rec}$ of stock suspension therethrough which is measured. The recirculation flow $Q_{rec}$ is regulated by regulation means such as a regulation valve 14. The front wall of the header 12 is connected with a turbulence generator 15, which comprises one or two successive tube batteries. When two tube batteries are used, there may be an equalizing chamber (not shown) in itself known between the batteries. The downstream side of the turbulence generator 15 is connected to a slice channel 16 which becomes narrower in the flow direction x and has a slice opening 17 from which the pulp suspension jet J is discharged onto a forming wire or into a forming gap defined between two wires.

In the illustrations in the present application, the steps and devices of the papermaking process following after the headbox 100 are not illustrated in more detail, because they are known in themselves to a person skilled in the art. To these process steps, reference is made just by the block 200 in the block diagram in FIG. 5.

As shown in FIGS. 1 and 2, in connection with the front wall of the header 12 and/or in connection with the turbulence generator 15, dilution flow means such as feed ducts 18 for dilution water, preferably white water, are opened. Feed ducts 18 are provided with regulation means such as valves 18a by whose means the distribution of the flow of dilution water in the cross-machine direction is regulated, and in this way, the distribution of the consistency of the headbox flow rate in the cross direction y is regulated (FIG. 2). Further, the headbox 100 may be provided with regulation spindles 20 for regulation of the cross-sectional flow area of the header 12. At both sides of the headbox, edge flow feeds 21 of stock have been arranged, which are provided with regulation means such as valves 21a. The slice channel 16 is provided with regulation spindles 19, by whose means the narrowing of the slice channel and/or the profile of the height of the slice opening 17 is/are regulated in the cross direction y. At the upstream side of the slice channel 16, in the flow direction, a series of detectors 22 for the measurement of static pressure are arranged. Also, if necessary, the tubes in the turbulence generator 15 can be provided with actuators such as throttle valves, which regulate the pressure loss profile in the cross direction y. These devices are not shown in the illustrations. Each of the actuator, valves and spindles may have a set operating value or parameter, a change in which varies the operation thereof.

In accordance with the denotations used in FIG. 2, the quantities of measurement and regulation of a single-layer headbox will be given in the following: y=cross direction of the web, x=machine direction of the web, and z=direction of thickness of the web. When a quantity has been denoted as a function of y, i.e. f(y), a cross-direction profile is concerned, which is regulated or computed in accordance with the present invention.

| | |
|---|---|
| $P_{in}$, $C_{in}$, $Q_{in}$ | static pressure, consistency and flow rate of the stock flow into header 12; |
| $U_{in}$ (x, z) | velocity profile of the flow into the header 12; |
| $A_{in}$ (y) | profile of cross-sectional area of header 12; |
| C (y), $Q_D$ (y) | profiles of consistency and flow rate of the dilution feed 18; |
| $\Delta p_t$ (y), $C_D$ (y) | pressure-loss profile of turbulence generator 15, consistency profile produced by dilution at the outlet end of turbulence generator; |
| $Q_{rec}$, $Q_{e1}$, $Q_{e2}$ | recirculation flow rate and additional-feed flow rates at forward edge and rear edge; |
| b (x, y) | (measured/regulated) shape of slice channel 16 in machine (x) and cross direction (y); |
| u (y), v (y), w (y) | velocity component of slice jet J: u = velocity component in machine direction, v = in cross direction, and w = in z-direction; |
| $C_{jet}$ (y), $t_{jet}$ (y), $E_{jet}$ (y) | consistency, thickness, and turbulence-energy profiles of the slice jet J; |
| $Q_{jet,tot}$ | overall flow rate of slice jet J. |

Figure 3:
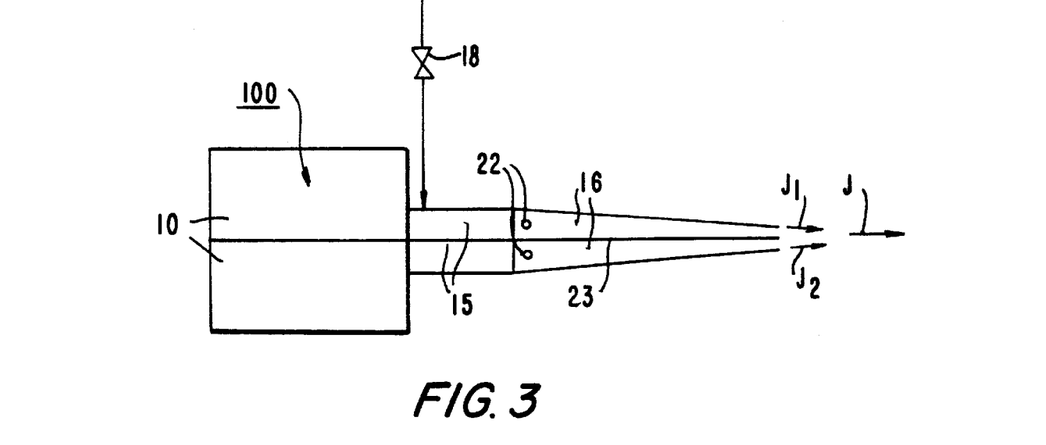
FIG. 3 is a schematic vertical sectional view of a two-layer headbox as an environment of application of the invention.
Figure 4:
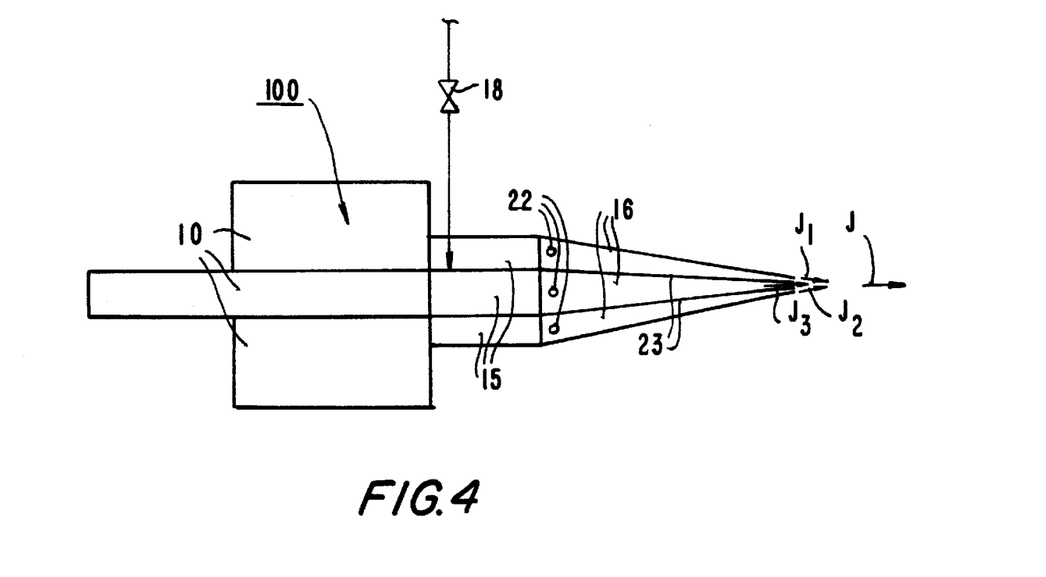
FIG. 4 is an illustration similar to FIG. 3 of a three-layer headbox as an environment of application of the invention, and this headbox may also be a headbox in accordance with the assignee's Finnish Patent Application No. 933030 (which corresponds to European Patent Application No. 94850116 and U.S. Pat. No. 5,490,905).

FIG. 3 is a schematic vertical sectional view in the machine direction of a multi-layer headbox construction, while the same reference numerals are used as in FIG. 1. FIG. 3 shows a headbox 100, in which the stock flow passage 10,15,16 has been divided into two layers placed one above the other. In the area of the slice channel 16, there is an intermediate plate 23. Out of the slice channels 16, component jets $J_1$ and $J_2$ are discharged, which are combined into the slice jet J. In the three-layer headbox as shown in FIG. 4, the stock suspension flow duct 10,15,16 has been divided into three layers placed one above the other, and in the area of the narrowing slice channel 16 there are two intermediate plates 23. Out of the slice channels 16, component jets $J_1$, $J_2$ and $J_3$ are discharged, which are combined into the slice jet J. When the invention is applied in a multi-layer headbox as shown in FIGS. 3 and 4, it is necessary to take into account the static and dynamic pressures between the different layers and the forces applied from these pressures to the plate 23 separating the layers. If the plate(s) 23 is/are fixed, the forces are limited by the strength of the construction. If the plate(s) 23 is/are provided with hinges and/or is/are flexible, in the program that is applied in the present invention the factual location of the plate or plates 23 must be computed. This computation may be made as a part of the regulation process based on measurements provided by the instrumentation of the headbox.

Figure 5:
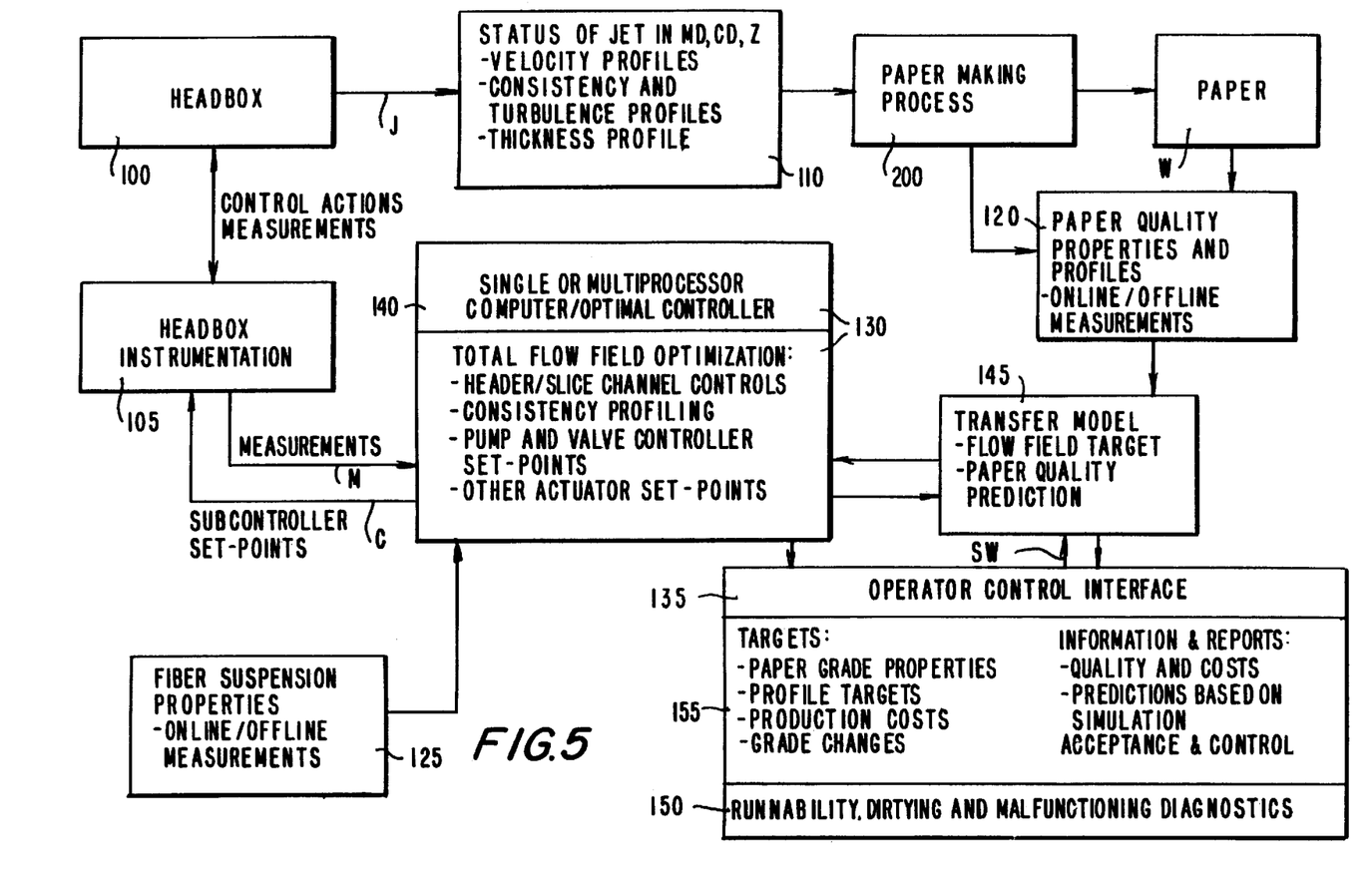
FIG. 5 illustrates a regulation system that makes use of the method in accordance with the present invention as a block diagram.

FIG. 5 is a schematic illustration of the construction of the system of regulation that carries out the method of the present invention as a block diagram. FIG. 5 shows the headbox 100, which is illustrated above in FIGS. 1–4 and out of which the pulp suspension jet J is discharged. The velocity, consistency, thickness, and turbulence profiles of the jet J in the machine direction and in the direction of thickness are obtained by solving the flow model. The entire paper-making process after the headbox, which process is in itself known, is represented by the block 200. The block 200 represents the former, the press section, and the dryer section of the paper machine and possibly also the finishing devices.

The transfer function of this process part 200, i.e., the transfer model mentioned above is known, and it is utilized in the invention in the way that was described above and that will be described later. The properties of the finished paper W, such as quality properties and profiles, are measured before the reel-up by means of on-line or off-line measurements in themselves known, which is illustrated by the block 120. Block 120 communicates with the block 145, which illustrates the above transfer model. The properties of the paper stock discharged through the approach pipe 10 are measured by means of on-line or off-line measurements, which is represented by the block 125.

According to FIG. 5, the core of the system of regulation is the optimal controller 130, to which the target values or set values SW are given with respect to the properties of the paper W and with respect to the production costs through the operator control interface 135. The headbox 100 is connected with its instrumentation, which is illustrated schematically by the block 105, from which the necessary measurement results M are obtained, which are passed to the optimal controller 130. From the optimal controller 130, the set values and the regulation quantities C are received for the instrumentation 105 of the headbox.

The optimal controller 130 includes a computer 140 having a high computing capacity, in which the software has been stored that controls the various steps of the method and carries out the necessary computing. The same computer 140 may also operate as a computer that controls the entire papermaking process. The system of regulation includes devices 150 that effect alarms concerning contamination of the headbox 100 and failure operations of the regulation system, these devices being connected with the rest of the system of regulation through the operator control interface 135.

The optimal controller 130 has knowledge of the geometry of the headbox 100, receives information on the state of the headbox 100 by means of measurements and mechanical controls, and on their basis computes the overall flow state of the headbox 100 at each particular time. Starting from the basic equations of the flow, from the quality properties and profiles of the paper W, which can be measured either in an on-line process or from off-line paper, from the flow properties of the stock (consistency, composition, fiber length, etc.), the optimal controller 130 computes the set values for the instrumentation 105 and for the auxiliary devices of the headbox 100, such as pumps, in relation to the quality and production-cost target values set by the operator through the operator control interface 135 so as to accomplish a coordinated optimal flow state. Of the production costs, it is possible to analyze, for example, the extent of the recirculation flow rate $Q_{rec}$ and the necessary overall flow, which determine the necessary quantity of water and the pumping costs. Of the quality and grade quantities should be mentioned, for example, the basis weight and fiber-orientation and formation profiles, all of which are directly and simultaneously dependent on the velocity field and the consistency and turbulence state of the slice jet J, which are obtained as a result of the computations.

According to FIG. 5, as to its main principles, the system of regulation that makes use of the method of the present invention is a closed, feedback-connected system of regulation, whose "actual values" are the various quality properties and y-direction cross profiles of the paper web W coming from the papermaking process 200, and whose set values SW are formed in the unit 155, in which the information necessary for the operator is formed and displayed and reports are given on the paper W quality and on the production costs as well as the predictions base on simulation. On their basis, the instrumentation 105 of the headbox 100 is controlled by means of the optimal controller 130. The outer and wider regulation loop in the system of regulation in accordance with the present invention is a loop formed by the instrumentation 105 of the headbox 100, by the measurements M, by the optimal controller 130, by the transfer model 145, and by the set values SW, and the inner narrower cycle of regulation is C→105→M→130.

The operation of the system of regulation sketched in FIG. 5 is based on the idea that the flows in the headbox 100 are illustrated as precisely as possible by means of a physical flow model, which is solved numerically by means of the computer 140.

As an example of a physical flow model should be mentioned the Navier-Stokes equations (1) and (2):

$$\rho \frac{\partial \vec{u}}{\partial t} - \nabla \cdot [\mu(\nabla \vec{u} + \nabla \vec{u}^T)] + \rho(\vec{u} \cdot \nabla)\vec{u} + \nabla p = \rho \vec{f} \quad (1)$$

$$\nabla \cdot \vec{u} = 0 \quad (2)$$

wherein $\vec{u}$ is the flow velocity, $\vec{f}$ is the static pressure, is the volumetric force (e.g., gravitation), $\mu$ is the effective viscosity of flowing material, and $\rho$ is the density of the material.

For the fiber suspension flow in the headbox 100, besides for the fluid flow, equations are also needed for the dry solids and for the turbulence. It is a substantial feature of the physical flow model that it is derived starting from basic equations of physics and not, for example, by fitting values that have been measured from the processes statistically into simple interdependencies or response models.

In the final part of the papermaking process 200, the properties of the paper W are measured on-line (block 120 in FIG. 4). Further, it is possible to make use of off-line laboratory measurements. The most important properties of paper W are, for example, the basis weight and fiber orientation profiles in the direction of width of the machine, i.e., in the cross direction y.

When the properties $R^p$ of paper W (p=paper) are known by means of measurements (block 120), and when the properties of the jet $R^j$ (j=jet) are known by means of the flow model, based on these properties, it is possible to form a transfer mapping T, i.e. the above transfer model for the effect of the papermaking process 200 on said property when moving from the jet J of FIG. 2 to finished paper W:

$$T:R^j \rightarrow R^p$$

The property R mentioned above is, for example, basis weight profile, i.e., $R^j$ is the numerically simulated basis weight profile in the jet J, and $R^p$ is the measured basis weight profile in the finished paper W.

The inverse mapping of this mapping is:

$$T^{-1}:R^p \rightarrow R^j$$

For the optimal controller 130, it must be defined what is aimed at in the optimizing. Some of the most important aims of the stage of optimizing in the method of the present invention are the quality requirements of the paper W. When the inverse mapping of the transfer function T is known, by its means it is possible to set the targets for the slice jet of the headbox 100. For example, if an orientation profile $\theta^P(y)$ is desired for the paper, it is reported to the system of regulation that in the jet J the orientation profile must be $T^{-1}(\theta^P(y))=\theta^j(y)$. In a corresponding manner, a target basis weight profile of paper W is transferred to be the target basis weight profile in the slice jet J. Moreover, it can be set as a target to reach these quality requirements with minimal costs of operation of the headbox. For example, it is possible to aim at a minimal recirculation $Q_{rec}$.

The target of the stage of optimizing of the invention is written as a cost function. The cost function determines in a mathematical form how near or far the desired target is. Generally, the cost function is of the form:

$$F = \sum_{k=1}^{n} w_k \| R^j_k - R^j_{k*} \| + \sum_{l=1}^{m} e_l \| E_l - E_{l*} \| \quad (5)$$

wherein $R^j_k$ means the property k=1, . . . , n simulated by means of the flow model in the jet, and $R^j_k{}^*$ means the target property obtained by means of an inverse mapping from the properties of the paper in the slice jet J, i.e., $R^j_k{}^* = T^{-1}(R^P)$. The weight function $w_k$ determines the relative weights of the different properties in the cost function. In the second part of the cost function, it has been produced as a pattern how close the other economical, energy-consumption or runability targets $E_1$ are to the preset targets $E_{1*}$ as weighted with the target-specific weight coefficient $e_1$ (1=1, . . . , m). Here the norm $\|X-X_*\|$ means the distance of the actual value X from the target $X_*$ which can be defined over a certain geometry, for example as the $L_2$-norm, i.e., integral of the second power of the difference:

$$\|X - X_*\| = \frac{1}{L} \int_0^L (X - X_*)^2 dy \quad (6)$$

The value of the cost function F depends on the solutions $S_k$ of the flow model of the headbox 100, which again depends on the set values of the regulation quantities $\vec{\alpha} = [\alpha_1 \ldots \alpha_n]$ of the headbox 100. Thus, the cost function is obtained in the form:

$$F(S(\vec{\alpha})) = \sum_{k=1}^{n} w_k \| R^j_k(S(\vec{\alpha})) - T^{-1}_k(R^P) \| + \sum_{l=1}^{m} e_l \| E_l - E_{l*} \|$$

The first part of the cost function to be optimized can also be formed directly for the quality requirements of paper W by using the pattern T, because $$\| R^j(S(\vec{\alpha})) - T^{-1}(R^P) \| = \| T(R^j(S(\vec{\alpha}))) - R^P \| \quad (8)$$

if and when the properties $R^P$ of the paper W can be represented sufficiently unequivocally by means of the properties $R^j$ of the jet J. In such a case, the weight coefficients of the cost function must be considered in relation to the properties $R^P$ of the paper W and not in relation to the properties $R^j$ of the jet, i.e., either (1) one moves from the properties of the paper W to the properties of the slice jet J by means of the inverse mapping $T^{31\ 1}$; or (2) from the properties of the slice jet J to the properties of the paper W by means of the mapping T.

The purpose of the optimizing stage applied in the present invention is to minimize the cost function $(F(S(\vec{\alpha})))$ so that the solution $S(\vec{\alpha})$ carries into effect the flow model of the headbox 100 and that the values of the regulation variables $C = \vec{\alpha} = [(\alpha_1 \ldots \alpha_n]$ are included in the admissible regulation values.

On the other hand, it is desirable to maximize some quantity, for example $E_g$, the norm $\|g(E_g)\|$ in respect of this property can always be written so that the value of the cost function reaches the minimum while the quantity $g(E_g)$ is maximized or while the quantity $-g(E_g)$ is minimized.

For the practical conditions, the operator may look for the best combinations of the weight coefficients $w_k$ and $e_1$ of the cost function (formula (5)) by using the flow model of the optimal regulator of the headbox and the transfer model 145 to simulate the effects of the combinations of different regulations and weight coefficients on the paper W that is being manufactured.

Figure 6:
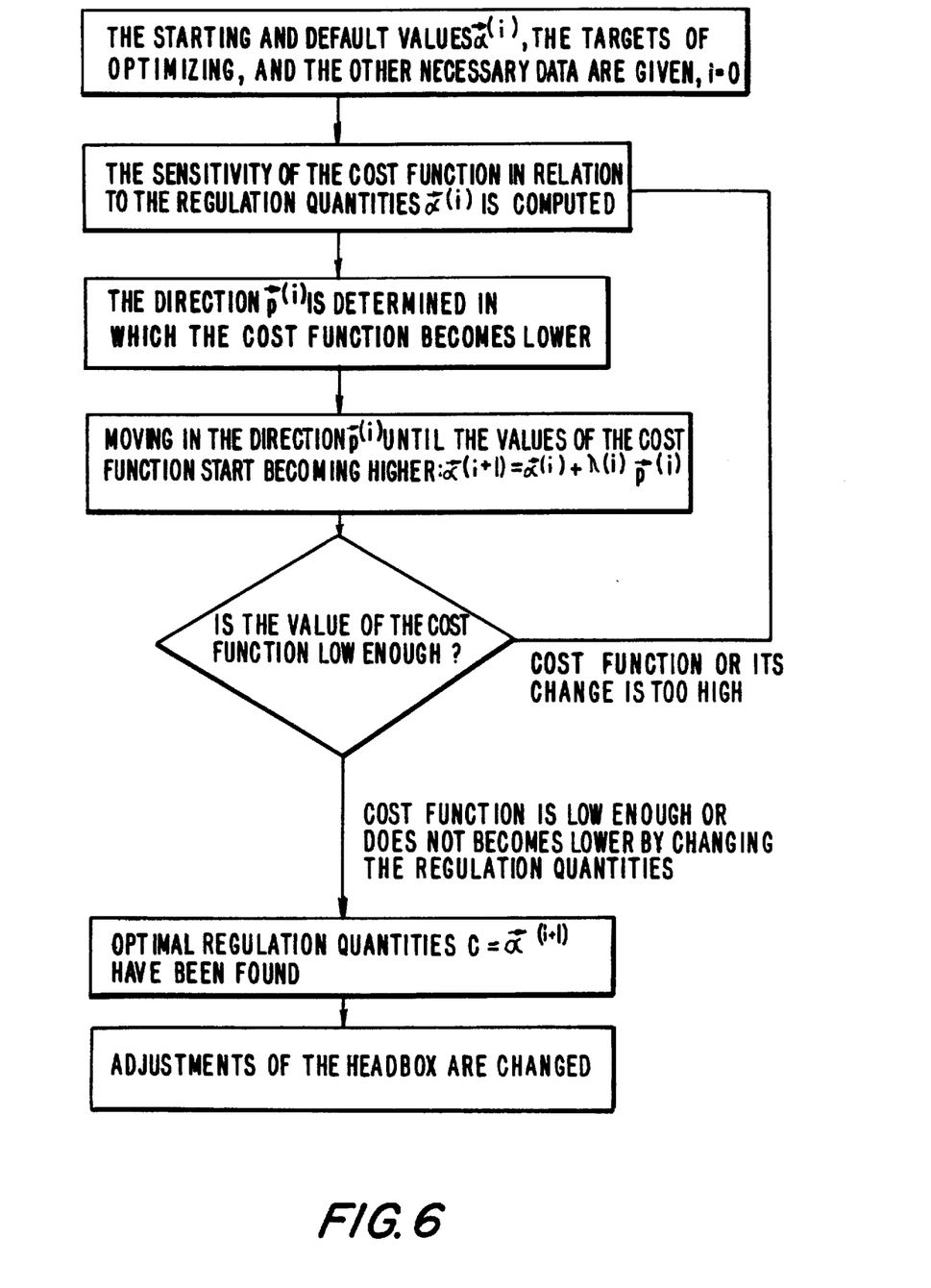
FIG. 6 illustrates a mode of carrying out of a stage of optimizing included in the method in accordance with the invention as a flow diagram.

The stage of optimal regulation applied in the invention operates, for example, in accordance with the following algorithm (a corresponding flow diagram is given in the accompanying FIG. 6):

0. The necessary flow-rate, stock-grade and geometry data of the headbox 100 are read. The optimizing is started from the default values, i=0, and the value $F^{(i)}$ of the cost function is computed by solving the flow model of the headbox 100.

1. The gradient $\nabla F^{(i)}$ of the cost function with the regulation values $\vec{\alpha}^{(i)}$ concerned is computed. The computing of the gradient (=sensitivity of the cost function in relation to the regulation) requires solution of the flow model of the headbox 100.

2. The direction $\vec{p}^{(i)}$ is determined which states in what direction the regulation quantities must be changed in order to lower the value of the cost function. At the simplest, the direction can be the direction $\vec{p}^{(i)} = -\nabla F^{(i)}$ obtained by means of the gradient. This is what is called the gradient method, i.e., the steepest descent direction method. Other gradient-based methods are, for example, the conjugate gradient method and the quasi-Newton's methods.

3. The new values of the regulation values $\vec{\alpha}^{(i+1)}$ (FIG. 4) are obtained by varying them in that direction optimally $$\vec{\alpha}^{(i+1)} = \vec{\alpha}^{(i)} + \lambda^{(i)} \vec{p}^{(i)}, \quad (9)$$

i.e., the step length $\lambda^{(i)}$ is determined so that the cost function receives a lower value than with the preceding iteration, $F^{(i+1)} < F^{(i)}$, and the regulation quantities $\vec{\alpha}^{(i+1)}$ are permitted. In the search for a good step length, computing of the values of the cost function and, thus, solution of the flow model are required.

4. If the value of the cost function is not yet sufficiently low, an index for iteration step is increased, i=i+1, and optimizing is continued from point 1. In the contrary case, optimizing is discontinued, and the values of optimal regulation quantities $C = \vec{\alpha}^{(i+1)}$ are transmitted to the regulation devices 105 of the headbox 100.

The examples provided above are not meant to be exclusive. Many other variations of the present invention would be obvious to those skilled in the art, and are contemplated to be within the scope of the appended claims.

We claim:

1. A method for the continuous overall regulation of a single-layer or multi-layer headbox of a paper, board or pulp-draining machine, comprising the steps of:

(a.) forming a physical fluid flow model of a pulp suspension flow to be regulated in the headbox and upon discharge from the headbox, the pulp suspension flow being processed after discharge from the headbox to produce paper;

(b.) solving the flow model to obtain a simulated flow state based on data on a geometry of the headbox and initial and boundary conditions related to the headbox;

(c.) obtaining a target flow state based on quality requirements of the paper produced from the pulp suspension flow and costs of operation and runnability of the machine;

(d.) determining a difference between the simulated flow state obtained as the solution of the flow model and the target flow state, the difference constituting a cost function;

(e.) optimizing the cost function and then determining optimal regulation values for regulation devices of the headbox which affect the pulp suspension flow in view of the cost function; and thereafter;

(f.) providing the optimal regulation values to the regulation devices of the headbox such that the regulation devices of the headbox operate at the optimal regulation values to thereby realize the optimization of the cost function, the step of optimizing the cost function and then determining optimal regulation values for the regulation devices of the headbox being carried out in accordance with the following algorithm:

(1) a necessary flow-rate, stock-grade and geometry data of the headbox are read, and the optimizing is started from a first set of regulation values $\vec{\alpha}^{(i)}$, i=0, and a value $F^{(i)}$ of the cost function is computed by solving the flow model of the headbox, (2) a gradient $\nabla F^{(i)}$ of the cost function with the first set of regulation values $\vec{\alpha}^{(i)}$ concerned is computed, (3) a direction $\vec{p}^{(i)}$ is determined by means of the gradient $\nabla F^{(i)}$ and indicates the direction the first set of regulation values must change in order to lower the value of the cost function, a sensitivity of the cost function F in relation to a regulation quantity $\alpha_k$ based on the first set of regulation values being computed by means of a difference quotient $$\frac{\partial}{\partial_k} F = \frac{F(\alpha_k + \epsilon) - F(\alpha_k)}{\epsilon}$$

or by solving an adjoint state equation corresponding to the flow model of the headbox, (4) a second set of regulation values $(\vec{\alpha}^{(i+1)}$ are determined by varying the first set of regulation values in the direction determined in the preceding step (3) optimally $$\vec{\alpha}^{(i+1)} = \vec{\alpha}^{(i)} + \lambda^{(i)} \vec{p}^{(i)},$$

in which connection a step length $\lambda^{(i)}$ is determined so that the cost function receives a lower value than with the preceding iteration, $F^{(i+1)} < F^{(i)}$, and the second set of regulation values $(\vec{\alpha}^{(i+1)}$ are admissible, and (5) if the value of the cost function obtained in the preceding steps is not yet sufficiently low, an index for iteration step is increased, i=i+1, the second set of regulation values becomes the first set of regulation values and optimizing is continued from the above stage (2), and in a contrary case when the value of the cost function obtained in the preceding steps is sufficiently low, performing of the algorithm is discontinued, and the optimal values of regulation devices are set equal to the second set of regulation values $\vec{\alpha}^{(i+1)}$ and they are transmitted to the regulation devices of the headbox.

2. The method of claim 1, wherein the step of forming the flow model comprises the steps of:

forming the flow model on the basis of fluid dynamics relationship or on the basis of simplified equations derived from fluid dynamics relationships which are solved numerically by means of a computer, and utilizing on-line or laboratory measurements and information provided by an operator of the paper machine as the initial and boundary values of the flow model.

3. The method of claim 1, further comprising the steps of:

computing a plurality of flow states by means of a physical model, adapting a statistical model from the plurality of flow states to illustrate the flow state of the headbox and/or the dependency of the cost function from regulation quantities based on the regulation values, or instructing a neural network to illustrate the flow state of the headbox and/or the dependency of the cost function from regulation quantities based on the regulation values from the plurality of flow states, and utilizing the statistical model or the neural network for optimizing the cost function.

4. The method of claim 1, wherein the step of solving the flow model comprises the steps of:

using a computer having a high computing capacity and comprising at least one processor, and directing the computer to use numerical methods of solution.

5. The method of claim 4, further comprising the step of selecting the numerical methods of solution from a group consisting of finite-element, finite-difference, finite-volume methods, spectral and spectral-element methods.

6. The method of claim 1, wherein the step of optimizing the cost function is determined by an algorithm and is not based on computing the gradient of the cost function.

7. The method of claim 1, further comprising the step of selecting measurement and regulation quantities of the headbox to be regulated based on the optimal regulation values from a group consisting of static pressure, consistency, and flow rate of the stock flow into the header; velocity profile of the flow into the header; profile of cross-sectional area of header; profiles of consistency and flow rate of dilution feed; pressure-loss profile of turbulence generator, consistency profile produced by dilution at the outlet end of turbulence generator; recirculation flow rate and edge feed flow rates at forward edge and rear edge; measured/regulated shape of slice channel in machine and cross direction; velocity components of slice jet; consistency, thickness and turbulence-energy profiles of the slice jet; and overall flow rate of the slice jet.

8. The method of claim 1, wherein the cost function comprises at least the target profile of finished paper selected from a group consisting of a basis weight profile, a formation profile and a fiber-orientation profile, or a function of at least one target profile selected from a group consisting of the basis weight profile, the formation profile and the fiber-orientation profile.

9. The method of claim 8, wherein besides the at least one target profile, the cost function also comprises components related to runnability and/or energy consumption of the paper machine.

10. The method of claim 1, wherein the cost function is optimized by selecting a quality level for the paper, and determining at least one of a lowest possible overall flow rate and energy consumption at which the selected quality level for the paper is reached by minimizing a recirculation flow rate of the pulp suspension flow until the selected quality level for the paper is reached.

11. The method of claim 1, further comprising the step of weighting different parts of the cost function, the parts being quality of the paper, runnability of the machine and energy consumption of the machine.

12. The method of claim 11, wherein the step of weighting different parts of the cost function comprises the steps of assigning the quality of the paper with a highest weight and thus most important part, and assigning the runnability of the machine and energy consumption of the machine lesser weights that the weight assigned to the quality of the paper such that the runability of the machine is improved and energy is saved only if improvement in the runnability of the machine and saving of energy does not cause a deterioration in the quality of the paper.

13. The method of claim 1, wherein the cost function includes quality quantities which are expressed by means of a velocity profile and turbulence of a slice jet of the pulp suspension flow being discharged from the headbox.

14. The method of claim 1, wherein the step of solving the flow model comprises the steps of:
   using a computer having a high computing capacity and comprising at least one processor, and
   increasing a speed in which the computer solves the flow model by performing computations in parallel.

15. The method of claim 14, wherein the computer comprises a plurality of processors and the speed of the computer is increased by computing each of a plurality of sensitivities of changes in the cost function in relation to different regulation devices of the headbox by means of a separate processor in the computer.

16. The method of claim 15, wherein the sensitivities of the cost function in relation to different regulation devices are determined by means of a sensitivity analysis carried out in an environment of linearized solution so that the flow model is solved by means of a perturbation theory by determining the gradient of the cost function, wherein for the optimization of the cost function, in other respects, a real non-linear model is used such that the optimization is based on a real flow model, and any faults arising from the perturbation theory do not have a substantial effect on the final result of the optimization.

17. The method of claim 1, wherein the step of solving the flow model comprises the steps of:
   composing the flow model of the headbox from several sub-models,
   simultaneously solving the sub-models by means of processors of a computer, each of the sub-models being solved by means of a respective one of the processors and
   directing data from each of the processors to other ones of the processors.

18. The method of claim 1, wherein the step of solving the flow model comprises the step of:
   using a computer; and
   enhancing operation of the computer by dividing the optimizing into parts so that regulation quantities based on the regulation values that have the greatest effect on quality of the paper are optimized more frequently while reacting to the changes rapidly, whereas other regulation quantities are optimized less frequently, and that for optimizing of the regulation quantities for which all of the flow model is not needed a suitable sub-model is used.

19. A method for the continuous overall regulation of a single-layer or multi-layer headbox of a paper, board or pulp-draining machine, comprising the steps of:

(a.) forming a physical fluid flow model of a pulp suspension flow to be regulated in the headbox and upon discharge from the headbox, the pulp suspension flow being processed after discharge from the headbox to produce paper;

(b.) solving the flow model to obtain a simulated flow state based on data on a geometry of the headbox and initial and boundary conditions related to the headbox;

(c.) obtaining a target flow state based on quality requirements of the paper produced from the pulp suspension flow and costs of operation and runnability of the machine (d.) determining a difference between the simulated flow state obtained as the solution of the flow model and the target flow state, the difference constituting a cost function, the cost function comprising at least one target profile of the paper selected from a group consisting of a basis weight profile, a formation profile and a fiber-orientation profile, or a function of at least one target profile selected from a group consisting of a basis weight profile, a formation profile and a fiber-orientation profile;

(e.) optimizing the cost function and then determining optimal regulation values for regulation devices of the headbox which affect the pulp suspension flow in view of the cost function; and thereafter (f.) providing the optimal regulation values to the regulation devices of the headbox such that the regulation devices of the headbox operate at the optimal regulation values to thereby realize the optimization of the cost function.

20. The method of claim 19, wherein besides the at least one target profile, the cost function also comprises components related to runnability and/or energy consumption of the paper machine.

21. A method for the continuous overall regulation of a single-layer or multi-layer headbox of a paper, board or pulp-draining machine, comprising the steps of:

(a.) forming a physical fluid flow model of a pulp suspension flow to be regulated in the headbox and upon discharge from the headbox, the pulp suspension flow being processed after discharge from the headbox to produce paper;

(b.) solving the flow model to obtain a simulated flow state based on data on a geometry of the headbox and initial and boundary conditions related to the headbox;

(c.) obtaining a target flow state based on quality requirements of the paper produced from the pulp suspension flow and costs of operation and runnability of the machine (d.) determining a difference between the simulated flow state obtained as the solution of the flow model and the target flow state, the difference constituting a cost function;

(e.) optimizing the cost function and then determining optimal regulation values for regulation devices of the headbox which affect the pulp suspension flow in view of the cost function, the cost function being optimized by selecting a quality level for the paper, and determining at least one of a lowest possible overall flow rate and energy consumption at which the selected quality level for the paper is reached by minimizing a recirculation flow rate of the pulp suspension flow until the selected quality level for the paper is reached; and thereafter (f.) providing the optimal regulation values to the regulation devices of the headbox such that the regulation devices of the headbox operate at the optimal regulation values to thereby realize the optimization of the cost function.

22. A method for the continuous overall regulation of a single-layer or multi-layer headbox of a paper, board or pulp-draining machine, comprising the steps of:

(a.) forming a physical fluid flow model of a pulp suspension flow to be regulated in the headbox and upon discharge from the headbox, the pulp suspension flow being processed after discharge from the headbox to produce paper;

(b.) solving the flow model to obtain a simulated flow state based on data on a geometry of the headbox and initial and boundary conditions related to the headbox;

(c.) obtaining a target flow state based on quality requirements of the paper produced from the pulp suspension flow and costs of operation and runnability of the machine (d.) determining a difference between the simulated flow state obtained as the solution of the flow model and the target flow state, the difference constituting a cost function;

(e.) weighting different parts of the cost function, the parts being quality of the paper, runnability of the machine and energy consumption of the machine;

(f.) optimizing the cost function and then determining optimal regulation values for regulation devices of the headbox which affect the pulp suspension flow in view of the cost function; and thereafter (g.) providing the optimal regulation values to the regulation devices of the headbox such that the regulation devices of the headbox operate at the optimal regulation values to thereby realize the optimization of the cost function.

23. The method of claim 22, wherein the step of weighting different parts of the cost function comprises the steps of assigning the quality of the paper with a highest weight and thus most important part, and assigning the runnability of the machine and energy consumption of the machine lesser weights than the weight assigned to the quality of the paper such that the runnability of the machine is improved and energy is saved only if improvement in the runnability of the machine and saving of energy does not cause a deterioration in the quality of the paper.

24. A method for the continuous overall regulation of a single-layer or multi-layer headbox of a paper, board or pulp-draining machine, comprising the steps of:

(a.) forming a physical fluid flow model of a pulp suspension flow to be regulated in the headbox and upon discharge from the headbox, the pulp suspension flow being processed after discharge from the headbox to produce paper;

(b.) solving the flow model to obtain a simulated flow state based on data on a geometry of the headbox and initial and boundary conditions related to the headbox, the step of solving the flow model comprising the steps of using a computer having a high computing capacity and a plurality of processors, and increasing a speed at which the computer solves the flow model by performing computations in parallel;

(c.) obtaining a target flow state based on quality requirements of the paper produced from the pulp suspension flow and costs of operation and runnability of the machine (d.) determining a difference between the simulated flow state obtained as the solution of the flow model and the target flow state, the difference constituting a cost function;

(e.) optimizing the cost function and then determining optimal regulation values for regulation devices of the headbox which affect the pulp suspension flow in view of the cost function; thereafter (f.) providing the optimal regulation values to the regulation devices of the headbox such that the regulation devices of the headbox operate at the optimal regulation values to thereby realize the optimization of the cost function; and (g.) increasing the speed of the computer by computing each of a plurality of sensitivities of changes in the cost function in relation to different regulation devices of the headbox by means of a separate one of the processors in the computer.

25. The method of claim 24, wherein the sensitivities of the cost function in relation to different regulation devices are determined by means of a sensitivity analysis carried out in an environment of linearized solution so that the flow model is solved by means of a perturbation theory by determining the gradient of the cost function, wherein for the optimization of the cost function, in other respects, a real non-linear model is used such that the optimization is based on a real flow model, and any faults arising from the perturbation theory do not have a substantial effort on the final result of the optimization.

26. A method for the continuous overall regulation of a single-layer or multi-layer headbox of a paper, board or pulp-draining machine, comprising the steps of:

(a.) forming a physical fluid flow model of a pulp suspension flow to be regulated in the headbox and upon discharge from the headbox, the pulp suspension flow being processed after discharge from the headbox to produce paper;

(b.) solving the flow model to obtain a simulated flow state based on data on a geometry of the headbox and initial and boundary conditions related to the headbox;

(c.) obtaining a target flow state based on quality requirements of the paper produced from the pulp suspension flow and costs of operation and runnability of the machine (d.) determining a difference between the simulated flow state obtained as the solution of the flow model and the target flow state, the difference constituting a cost function;

(e.) optimizing the cost function and then determining optimal regulation values for regulation devices of the headbox which affect the pulp suspension flow in view of the cost function; and thereafter (f.) providing the optimal regulation values to the regulation devices of the headbox such that the regulation devices of the headbox operate at the optimal regulation values to thereby realize the optimization of the cost function;

the step of solving the flow model comprising the steps of using a computer, and enhancing operation of the computer by dividing the optimizing into parts so that regulation quantities based on the regulation values that have the greatest effect on quality of the paper are optimized more frequently while reacting to the changes rapidly, whereas other regulation quantities are optimized less frequently, and that for optimizing of the regulation quantities for which all of the flow model is not needed a suitable sub-model is used.

27. A method for the continuous overall regulation of a single-layer or multi-layer headbox of a paper, board or pulp-draining machine, comprising the steps of:

(a.) forming a physical fluid flow model of a pulp suspension flow to be regulated in the headbox and upon discharge from the headbox, the pulp suspension flow being processed after discharge from the headbox to produce paper;

(b.) solving the flow model to obtain a simulated flow state based on data on a geometry of the headbox and initial and boundary conditions related to the headbox;

(c.) obtaining a target flow state based on quality requirements of the paper produced from the pulp suspension flow and costs of operation and runnability of the machine (d.) determining a difference between the simulated flow state obtained as the solution of the flow model and the target flow state, the difference constituting a cost function;

(e.) optimizing the cost function and then determining optimal regulation values for regulation devices of the headbox which affect the pulp suspension flow in view of the cost function; thereafter (f.) providing the optimal regulation values to the regulation devices of the headbox such that the regulation devices of the headbox operate at the optimal regulation values to thereby realize the optimization of the cost function; and (g.) selecting measurement and regulation quantities of the headbox to be regulated based on the optimal regulation values from a group consisting of static pressure, consistency, and flow rate of the stock flow into the headbox; profiles of consistency and flow rate of feed of a dilution liquid into the headbox; recirculation flow rate and edge feed flow rates at forward edge and rear edge of the headbox; measured/regulated shape of a slice channel of the headbox in machine and cross directions; velocity components of a slice jet of the headbox; consistency, thickness and turbulence-energy profiles of the slice jet; and overall flow rate of the slice jet.

* * * * *